(12) United States Patent
Nishikawa

(10) Patent No.: US 10,873,352 B2
(45) Date of Patent: Dec. 22, 2020

(54) RADIO-FREQUENCY MODULE AND COMMUNICATION APPARATUS

(71) Applicant: Murata Manufacturing Co., Ltd., Kyoto (JP)

(72) Inventor: Hiroshi Nishikawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/414,962

(22) Filed: May 17, 2019

(65) Prior Publication Data

US 2019/0273521 A1   Sep. 5, 2019

Related U.S. Application Data

(63) Continuation of application No. PCT/JP2017/045403, filed on Dec. 18, 2017.

(30) Foreign Application Priority Data

Dec. 27, 2016  (JP) ................................ 2016-254496

(51) Int. Cl.
*H04B 1/04* (2006.01)
*H04B 1/00* (2006.01)
(Continued)

(52) U.S. Cl.
CPC ............ *H04B 1/0475* (2013.01); *H03H 9/13* (2013.01); *H03H 9/205* (2013.01); *H03H 9/25* (2013.01);
(Continued)

(58) Field of Classification Search
None
See application file for complete search history.

(56) References Cited

U.S. PATENT DOCUMENTS

| | | | |
|---|---|---|---|
| 5,559,481 A | 9/1996 | Satoh et al. | |
| 6,351,195 B1 * | 2/2002 | Atokawa | H01P 1/2136 333/134 |

(Continued)

FOREIGN PATENT DOCUMENTS

| | | |
|---|---|---|
| JP | H05183380 A | 7/1993 |
| JP | 2005-45345 A | 2/2005 |

(Continued)

OTHER PUBLICATIONS

International Search Report for International Application No. PCT/JP2017/045403 dated Mar. 6, 2018.
(Continued)

*Primary Examiner* — Lana N Le
(74) *Attorney, Agent, or Firm* — Pearne & Gordon LLP

(57) ABSTRACT

A radio-frequency module (20) includes a module substrate (50) and a filter (21). The filter (21) has a sensitive GND electrode and a non-sensitive GND electrode that are connected to an external-connection ground terminal of the module substrate (50), and parallel-arm resonators. An inductance component generated by the sensitive GND electrode shifts, by a first shift amount, an attenuation pole that corresponds to a parallel-arm resonator and that is formed near a pass band. An inductance component generated by the non-sensitive GND electrode shifts, by a second shift amount, an attenuation pole that corresponds to a parallel-arm resonator and that is formed near the pass band. The first shift amount is larger than the second shift amount, and the distance between the sensitive GND electrode and the external-connection ground terminal is smaller than the distance between the non-sensitive GND electrode and the external-connection ground terminal.

2 Claims, 8 Drawing Sheets

(51) Int. Cl.

| | | |
|---|---|---|
| *H03H 9/13* | (2006.01) | |
| *H04B 1/52* | (2015.01) | |
| *H03H 9/205* | (2006.01) | |
| *H03H 9/54* | (2006.01) | |
| *H03H 9/56* | (2006.01) | |
| *H05K 1/02* | (2006.01) | |
| *H05K 1/18* | (2006.01) | |
| *H03H 9/25* | (2006.01) | |
| *H03H 9/64* | (2006.01) | |
| *H04B 1/18* | (2006.01) | |

(52) U.S. Cl.
CPC ............ *H03H 9/542* (2013.01); *H03H 9/568* (2013.01); *H03H 9/64* (2013.01); *H04B 1/00* (2013.01); *H05K 1/0216* (2013.01); *H05K 1/0243* (2013.01); *H05K 1/181* (2013.01); *H04B 1/18* (2013.01); *H04B 1/52* (2013.01); *H05K 2201/1006* (2013.01); *H05K 2201/10083* (2013.01)

(56) References Cited

U.S. PATENT DOCUMENTS

| | | |
|---|---|---|
| 2004/0032706 A1 | 2/2004 | Kemmochi et al. |
| 2005/0264375 A1 | 12/2005 | Ikuta et al. |
| 2006/0082408 A1 | 4/2006 | Seshita et al. |
| 2006/0267708 A1 | 11/2006 | Matsuda et al. |
| 2010/0103058 A1* | 4/2010 | Kato ................ G06K 19/07786 343/702 |
| 2012/0075002 A1 | 3/2012 | Uejima et al. |
| 2014/0055956 A1* | 2/2014 | Nakamura ........... H05K 1/0207 361/712 |
| 2014/0308906 A1* | 10/2014 | Saji ...................... H01L 23/5389 455/83 |
| 2015/0126131 A1* | 5/2015 | Mikata .................... H04M 1/24 455/67.11 |
| 2015/0180447 A1 | 6/2015 | Okuda |
| 2016/0088476 A1* | 3/2016 | Park ....................... H04W 12/06 455/411 |
| 2019/0304926 A1* | 10/2019 | Ryu ..................... H01L 23/552 |
| 2019/0311994 A1* | 10/2019 | Hong ..................... H05K 1/141 |

FOREIGN PATENT DOCUMENTS

| | | | |
|---|---|---|---|
| JP | 2005045345 A * | 2/2005 | |
| JP | 2006-14296 A | 1/2006 | |
| JP | 2006-333012 A | 12/2006 | |
| JP | 2011-254505 A | 12/2011 | |
| JP | 2014-17537 A | 1/2014 | |
| JP | 2014-239379 A | 12/2014 | |
| JP | 2006-121187 A | 5/2016 | |
| WO | 2010/143472 A1 | 12/2010 | |
| WO | WO-2012063517 A1 * | 5/2012 | .......... H03H 9/0071 |
| WO | 2014/045726 A1 | 3/2014 | |

OTHER PUBLICATIONS

Written Opinion for International Application No. PCT/JP2017/045403 dated Mar. 6, 2018.

\* cited by examiner

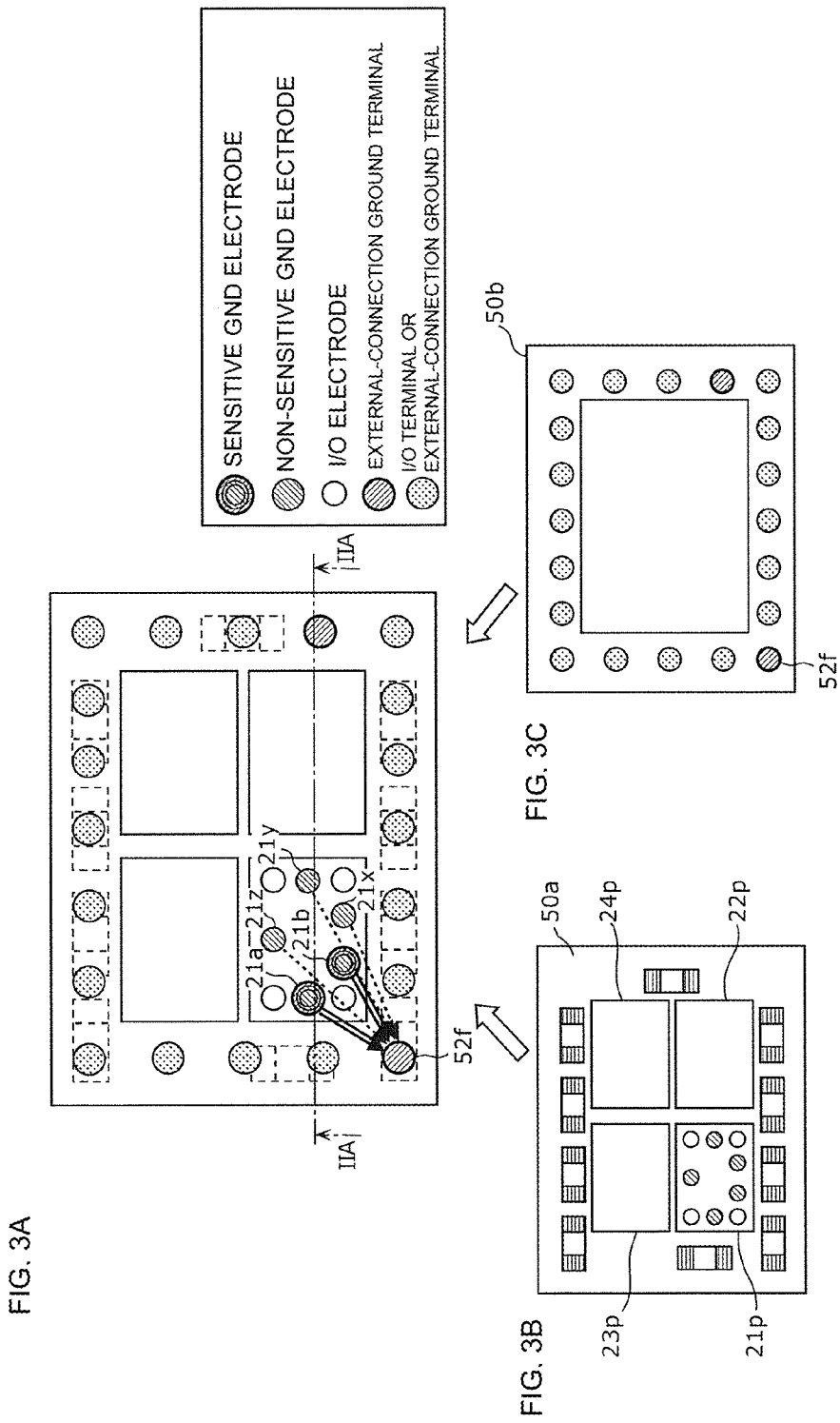

RADIO-FREQUENCY MODULE AND COMMUNICATION APPARATUS

This is a continuation of International Application No. PCT/JP2017/045403 filed on Dec. 18, 2017 which claims priority from Japanese Patent Application No. 2016-254496 filed on Dec. 27, 2016. The contents of these applications are incorporated herein by reference in their entireties.

BACKGROUND OF THE DISCLOSURE

Field of the Disclosure

The present disclosure relates to a radio-frequency module and a communication apparatus.

Description of the Related Art

In recent years, to cope with the miniaturization and higher integration of radio-frequency (RF) front-end circuits, RF modules including a filter circuit, a switch circuit, an amplifier circuit, and the like that are integrated together have been developed. Patent Document 1 discloses an RF switch module in which an RF switch for switching between a transmission path and a reception path is integrated with a surface acoustic wave (SAW) filter disposed on the reception path.

Patent Document 1: Japanese Unexamined Patent Application Publication No. 2011-254505

BRIEF SUMMARY OF THE DISCLOSURE

As the miniaturization and integration of RF modules advances, the distances between wiring lines and electrodes in a module substrate decrease, resulting in generation of a parasitic inductance and parasitic capacitance. The miniaturization and integration limits the number of ground terminals for external connection disposed on the module substrate, which prevents a sufficient ground potential from being secured. This causes an issue of degradation in the RF transmission characteristic of the RF module. However, Patent Document 1 disclosing the RF switch module does not refer to the issue of degradation in characteristics resulting from a parasitic inductance, a parasitic capacitance, and an insufficient ground potential generated in accordance with miniaturization and higher integration.

Accordingly, the present disclosure has been made to solve the above-described issue, and an object thereof is to provide an RF module in which the layout of wiring lines and ground electrodes are optimized to suppress degradation in an RF transmission characteristic and a communication apparatus.

To achieve the above-described object, a radio-frequency module according to an aspect of the present disclosure includes a module substrate having a first main surface and a second main surface that face away from each other and a plurality of external-connection ground terminals, a filter element mounted on the first main surface of the module substrate, and a switch IC mounted on the second main surface of the module substrate. The filter element has an input electrode and an output electrode, a first ground electrode connected to one of the plurality of external-connection ground terminals, a second ground electrode connected to one of the plurality of external-connection ground terminals, and one or more acoustic wave resonators connected between a path that connects the input electrode and the output electrode and the first ground electrode or the second ground electrode. An inductance component on a connection path that connects the first ground electrode and at least one acoustic wave resonator among the one or more acoustic wave resonators shifts, by a first shift amount, an attenuation pole that corresponds to the at least one acoustic wave resonator and that is provided near a pass band of the filter element. An inductance component on a connection path that connects the second ground electrode and one acoustic wave resonator among the one or more acoustic wave resonators shifts, by a second shift amount, an attenuation pole that corresponds to the one acoustic wave resonator and that is provided near the pass band. The first shift amount is larger than the second shift amount, and a distance between the first ground electrode and the external-connection ground terminal connected to the first ground electrode is smaller than a distance between the second ground electrode and the external-connection ground terminal connected to the second ground electrode in plan view of the module substrate.

When an inductance and capacitance are interposed between an acoustic wave resonator constituting the filter element and a ground electrode, an attenuation pole near the pass band of the filter element is changed. Furthermore, a parasitic inductance and parasitic capacitance interposed between the ground electrode in the filter element and an external-connection ground terminal disposed on the module substrate may change the attenuation pole in an unintended direction and may degrade an attenuation characteristic.

According to the above-described configuration, the first ground electrode that causes the attenuation pole near the pass band to be significantly shifted by an inductance component interposed between the first ground electrode and the acoustic wave resonator is closer to the external-connection ground terminal than the second ground electrode that causes the attenuation pole to be shifted by a smaller shift amount. Accordingly, a parasitic inductance component interposed between the first ground electrode, which is sensitive to a change in the attenuation characteristic of the radio-frequency module, and the external-connection ground terminal can be made smaller than a parasitic inductance interposed between the second ground electrode and the external-connection ground terminal. Thus, degradation in the attenuation characteristic and bandpass characteristic of the filter element can be suppressed. That is, the distances between the ground electrodes and the external-connection ground terminal are optimized by the degree of change in the attenuation pole near the pass band, and thus degradation in the attenuation characteristic and bandpass characteristic of the filter element can be suppressed.

The first ground electrode may be connected in common to two or more acoustic wave resonators connected to a first node on the path that connects the input electrode and the output electrode, and the second ground electrode may be connected to only one acoustic wave resonator connected to a second node on the path.

Accordingly, two or more acoustic wave resonators are connected in parallel between the first ground electrode and the first node. On the other hand, one acoustic wave resonator is connected between the second ground electrode and the second node. According to this configuration, an inductance between the two or more acoustic wave resonators and the ground shifts a resonant point of the two or more acoustic wave resonator by a first shift amount. On the other hand, an inductance between the one acoustic wave resonator and the ground shifts a resonant point of only the one acoustic wave resonator by a second shift amount. That is, the distances between the ground electrodes and the external-connection ground terminal are optimized by the number of parallel connections between the parallel-arm resonators and the ground electrode, and thus degradation in the attenuation characteristic and bandpass characteristic of the filter element can be suppressed.

One acoustic wave resonator among the one or more acoustic wave resonators may include one terminal connected to the path that connects the input electrode and the output electrode, and another terminal connected to a plurality of the second ground electrodes. Another acoustic wave resonator among the one or more acoustic wave resonators may include one terminal connected to the path that connects the input electrode and the output electrode, and another terminal connected to only the first ground electrode.

Accordingly, the one acoustic wave resonator is connected to a plurality of second ground electrodes, and the other acoustic wave resonator is connected to only one first ground electrode. According to this configuration, an inductance between the one acoustic wave resonator and the ground shifts the resonant point of the one acoustic wave resonator by a second shift amount. On the other hand, an inductance between the other acoustic wave resonator and the ground shifts the resonant point of the other acoustic wave resonator by a first shift amount. That is, the distances between the ground electrodes and the external-connection ground terminal are optimized by the number of ground electrodes connected to one parallel-arm resonator, and thus degradation in the attenuation characteristic and bandpass characteristic of the filter element can be suppressed.

An inductance component on a connection path that connects the second ground electrode and one acoustic wave resonator among the one or more acoustic wave resonators may shift, to a low-frequency side, an attenuation pole that corresponds to the one acoustic wave resonator and that is provided in a harmonic band of a radio-frequency signal in the pass band.

Accordingly, an inductance between an acoustic wave resonator for forming an attenuation pole in the harmonic band of the pass band and the ground does not significantly change the attenuation pole provided near the pass band. In this case, the ground electrode connected to the acoustic wave resonator is the second ground electrode. That is, the distances between the ground electrodes and the external-connection ground terminal are optimized by the interval between the pass band and the frequency at which the attenuation pole is provided, and thus degradation in the attenuation characteristic and bandpass characteristic of the filter element can be suppressed.

The filter element may be constituted by a ladder filter circuit having one or more series-arm resonators and one or more parallel-arm resonators. The one or more acoustic wave resonators may be the one or more parallel-arm resonators. The inductance component on the connection path that connects the first ground electrode and the at least one acoustic wave resonator among the one or more acoustic wave resonators may shift, to a low-frequency side by the first shift amount, the attenuation pole that corresponds to the at least one acoustic wave resonator and that is provided near the pass band of the filter element. The inductance component on the connection path that connects the second ground electrode and the one acoustic wave resonator among the one or more acoustic wave resonators may shift, to the low-frequency side by the second shift amount, the attenuation pole that corresponds to the one acoustic wave resonator and that is provided near the pass band.

Accordingly, degradation in the attenuation characteristic of the filter element can be suppressed with the low loss characteristic of the filter element being secured.

A radio-frequency module according to an aspect of the present disclosure includes a module substrate having a plurality of external-connection ground terminals, and a circuit element mounted on the module substrate. The circuit element has a circuit substrate, an input electrode and an output electrode that are disposed on the circuit substrate, a first ground electrode disposed on the circuit substrate and connected to one of the plurality of external-connection ground terminals, and a second ground electrode disposed on the circuit substrate and connected to one of the plurality of external-connection ground terminals. The first ground electrode is connected, on the circuit substrate, to an electrode or a wiring line that is disposed on the circuit substrate. The second ground electrode is not connected to either of the electrode and the wiring line that are disposed on the circuit substrate.

When an inductance and capacitance are interposed between an electrode and wiring line constituting the circuit element and a ground electrode, the radio-frequency transmission characteristic of the circuit element is changed. Furthermore, a parasitic inductance and parasitic capacitance interposed between the ground electrode in the circuit element and an external-connection ground terminal disposed on the module substrate may degrade the radio-frequency transmission characteristic.

According to the above-described configuration, the first ground electrode that causes the radio-frequency transmission characteristic to be degraded by an inductance component interposed between the first ground electrode and the electrode and wiring line is closer to the external-connection ground terminal than the second ground electrode that is not connected to the electrode and wiring line. Accordingly, a parasitic inductance component interposed between the first ground electrode, which is sensitive to a change in the transmission characteristic of the radio-frequency module, and the external-connection ground terminal can be reduced. Thus, degradation in the radio-frequency transmission characteristic of the circuit element can be suppressed. That is, the distance between the ground electrode and the external-connection ground terminal is optimized in accordance with whether or not the ground electrode is connected to the electrode and wiring line, and thus degradation in the radio-frequency transmission characteristic of the circuit element can be suppressed.

The radio-frequency module may further include an IC chip mounted on a rear surface of the module substrate or built in the module substrate. The plurality of external-connection ground terminals may be arranged on the rear surface of the module substrate. The module substrate may have a multilayer wiring structure. The first ground electrode or the second ground electrode may be connected to one of the plurality of external-connection ground terminals through a via wiring line and an in-layer wiring line of the module substrate.

Accordingly, the radio-frequency module can be miniaturized and highly integrated. In the above-described configuration, wiring paths for connecting the ground electrodes of the filter element and the external-connection ground terminal are arranged so as to avoid the IC chip. Even in this case, the distances between the ground electrodes and the external-connection ground terminal are optimized by the degree of change in the attenuation pole near the pass band, and thus degradation in the attenuation characteristic and bandpass characteristic of the filter element can be suppressed.

A radio-frequency module according to an aspect of the present disclosure includes a module substrate having a plurality of external-connection ground terminals, and a switch IC mounted on or in the module substrate. The switch IC has a unit switch circuit that has an input electrode, an output electrode, and a unit ground electrode and that switches between continuity and non-continuity between the input electrode and the output electrode, a first ground electrode connected to one of the plurality of external-connection ground terminals, and a second ground electrode connected to one of the plurality of external-connection ground terminals. The first ground electrode is connected, in the switch IC, to the unit ground electrode that is shared with a different unit switch circuit. The second ground electrode is connected, in the switch IC, to only the unit ground electrode provided for each unit switch circuit or is not connected to the unit ground electrode.

When an inductance and capacitance are interposed between a unit switch circuit constituting the switch IC and a ground electrode, the radio-frequency transmission characteristic in the unit switch circuit and the isolation characteristic between unit switch circuits are changed. Furthermore, a parasitic inductance and parasitic capacitance interposed between the ground electrode in the switch IC and an external-connection ground terminal disposed on the module substrate may degrade the radio-frequency transmission characteristic and isolation characteristic.

According to the above-described configuration, the first ground electrode that causes the radio-frequency transmission characteristic and isolation characteristic to be degraded to a higher degree is closer to the external-connection ground terminal than the second ground electrode that causes the radio-frequency transmission characteristic and isolation characteristic to be degraded to a lower degree. Accordingly, a parasitic inductance component or parasitic capacitance interposed between the first ground electrode, which is sensitive to a change of the radio-frequency transmission characteristic and isolation characteristic, and the external-connection ground terminal can be made smaller than a parasitic inductance component or parasitic capacitance interposed between the second ground electrode and the external-connection ground terminal. Thus, degradation in the radio-frequency transmission characteristic and isolation characteristic of the switch IC can be suppressed. That is, the distance between the ground electrode and the external-connection ground terminal is optimized in accordance with whether or not the ground electrode is connected in common to a plurality of unit ground electrodes, and thus degradation in the radio-frequency transmission characteristic and isolation characteristic of the switch IC can be suppressed.

A communication apparatus according to an aspect of the present disclosure includes the above-described radio-frequency module, and an RF signal processing circuit that processes a radio-frequency signal received from the radio-frequency module.

Accordingly, the distances between the ground electrodes and the external-connection ground terminal are optimized by the degree of change in the radio-frequency transmission characteristic of the radio-frequency module, and thus degradation in the radio-frequency transmission characteristic of the radio-frequency module can be suppressed.

According to the radio-frequency module or communication apparatus according to the present disclosure, the layout of wiring lines and ground electrodes are optimized, and thus degradation in the radio-frequency transmission characteristic can be suppressed.

BRIEF DESCRIPTION OF THE SEVERAL VIEWS OF THE DRAWINGS

FIGS. 3A, 3B and 3C include a perspective plan view, a front view, and a rear view illustrating the arrangement relationship among electrodes and terminals of the RF module according to the first embodiment.

DETAILED DESCRIPTION OF THE DISCLOSURE

Figure 1:
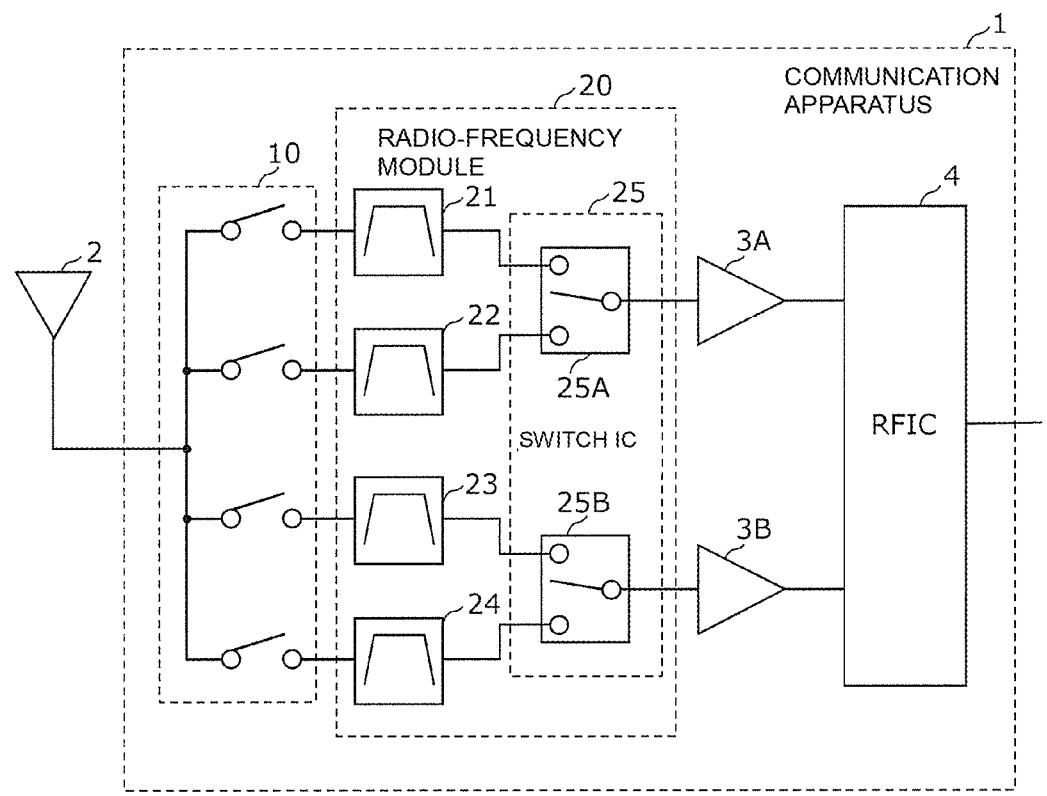
FIG. 1 is a functional block configuration diagram of a communication apparatus according to a first embodiment.

Hereinafter, embodiments of the present disclosure will be described in detail by using embodiments and the drawings thereof. Each of the embodiments described below illustrates general or specific examples. The values, shapes, materials, components, arrangement and connection styles of the components, and the like described in the following embodiments are merely examples and do not limit the present disclosure. Among the components in the following embodiments, a component that is not described in an independent claim will be described as an optional component. The sizes or size ratios of the components illustrated in the drawings are not always strict.

(First Embodiment)

[1.1 Configuration of Communication Apparatus]

FIG. 1 is a functional block configuration diagram of a communication apparatus 1 according to a first embodiment. FIG. 1 illustrates the communication apparatus 1 and an antenna element 2. The communication apparatus 1 includes a switch group 10, a radio-frequency (RF) module 20, receiving amplifier circuits 3A and 3B, and an RF signal processing circuit (RFIC) 4. The switch group 10 and the RF module 20 are disposed, for example, at a front-end portion of a multi-mode/multi-band cellular phone.

The switch group 10 is constituted by one or more switches (in the present embodiment, four SPST switches) each of which connects the antenna element 2 and a signal path corresponding to a predetermined band to each other in response to a control signal from a control unit (not illustrated). The number of signal paths connected to the antenna element 2 at the same time is not limited to one, but may be two or more. In other words, the RF module 20 may be compatible with carrier aggregation.

The RF module 20 is a circuit for transmitting an RF signal between the antenna element 2 and the RF signal processing circuit (RFIC) 4. Specifically, the RF module 20 transmits an RF signal (here, an RF reception signal) received by the antenna element 2 to the RF signal processing circuit (RFIC) 4 through a reception-side signal path.

The RF module 20 includes filters 21, 22, 23, and 24 and a switch IC 25.

The filters 21 to 24 are receiving filter elements each of which has a pass band different from each other, filters a reception signal received by the antenna element 2 and passed through the switch group 10 in the pass band, and outputs the reception signal to the receiving amplifier circuit 3A or 3B.

The switch IC 25 is constituted by one or more switches (in the present embodiment, two SPDT switches 25A and 25B). The switch 25A switches between the connection between the filter 21 and the receiving amplifier circuit 3A and the connection between the filter 22 and the receiving amplifier circuit 3A in response to a control signal from the control unit (not illustrated). The switch 25B switches between the connection between the filter 23 and the receiving amplifier circuit 3B and the connection between the filter 24 and the receiving amplifier circuit 3B in response to a control signal from the control unit (not illustrated). The number of filters connected to the receiving amplifier circuit 3A or 3B by the switch IC 25 at the same time is not limited to one.

The receiving amplifier circuits 3A and 3B are, for example, low-noise amplifiers that amplify RF reception signals received from the switches 25A and 25B, respectively.

In the RF module 20, an impedance matching circuit may be disposed before or after each filter, and before or after the switches 25A and 25B.

The antenna element 2 is a multi-band antenna that transmits or receives an RF signal. The antenna element 2 may be built in the communication apparatus 1.

The RF signal processing circuit (RFIC) 4 is an RF signal processing circuit that processes an RF signal that is transmitted or received by the antenna element 2. Specifically, the RF signal processing circuit (RFIC) 4 performs signal processing, such as down-converting, on an RF signal (here, an RF reception signal) received from the antenna element 2 through the reception-side signal path of the RF module 20, and outputs a low-frequency signal (here, a low-frequency reception signal) generated through the signal processing to a baseband signal processing circuit (not illustrated). In addition, the RF signal processing circuit (RFIC) 4 performs signal processing, such as up-converting, on a low-frequency signal (here, a low-frequency transmission signal) received from the baseband signal processing circuit (not illustrated), and outputs an RF signal (here, an RF transmission signal) generated through the signal processing to a transmission-side signal path (not illustrated).

The communication apparatus 1 may further include a baseband signal processing circuit (BBIC). The baseband signal processing circuit is a circuit that performs signal processing by using a low-frequency signal (for example, a baseband signal, an IF signal, or the like) having a lower frequency than an RF signal in the RF module 20. For example, the baseband signal processing circuit performs signal processing on a low-frequency signal (here, a low-frequency reception signal) received from the RF signal processing circuit (RFIC) 4, thereby generating an audio signal, an image signal, or the like. Also, for example, the baseband signal processing circuit performs signal processing on an audio signal, an image signal, or the like input thereto, and outputs a low-frequency signal (here, a low-frequency transmission signal) generated through the signal processing to the RF signal processing circuit (RFIC) 4.

In the present embodiment, the RF module 20 serving as a receiving demultiplexer circuit is described as an example of an RF module. However, the RF module according to the present disclosure may be a transmitting multiplexer circuit or a demultiplexer/multiplexer circuit capable of both transmission and reception. The number of frequency bands (signal paths) is not limited.

[1.2 Configuration of RF Module]

Figure 2A:
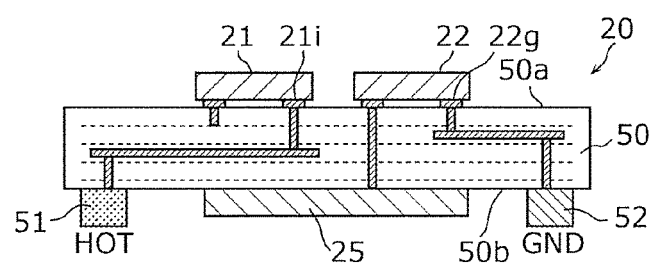
FIG. 2A is a cross-sectional configuration diagram of a radio-frequency (RF) module according to the first embodiment.

FIG. 2A is a cross-sectional configuration diagram of the RF module 20 according to the first embodiment. As illustrated in FIG. 2A, the RF module 20 includes the filters 21 to 24 (filters 23 and 24 are not illustrated), the switch IC 25, and a module substrate 50.

The filters 21 and 22 are mounted on a front surface 50a of the module substrate 50, and the switch IC 25 is mounted on a rear surface 50b. Also, an I/O terminal 51 and an external-connection ground terminal 52 are disposed on the rear surface 50b of the module substrate 50. The I/O terminal 51 is a hot terminal for transmitting/receiving an RF signal to/from a mounting substrate on which the RF module 20 is mounted. The external-connection ground terminal 52 is a terminal for connecting the ground of the RF module 20 to the ground of the mounting substrate. Although not illustrated in FIG. 2A, a plurality of I/O terminals 51 and a plurality of external-connection ground terminals 52 are disposed on the rear surface 50b. With this configuration, the RF module 20 is mounted on the mounting substrate such that the rear surface 50b faces the mounting substrate (mother board), with the I/O terminals 51 and the external-connection ground terminals 52 interposed therebetween. In addition, in the mounting structure in which the filters 21 to 24 are mounted on the front surface and the switch IC 25 is mounted on the rear surface, the I/O terminals 51 and the external-connection ground terminals 52 are arranged in an outer peripheral portion of the rear surface 50b (see FIGS. 3A, 3B and 3C).

In the present embodiment, a first main surface of the module substrate 50 is referred to as a front surface, and a second main surface facing away from the first main surface is referred to as a rear surface for convenience. Alternatively, the first main surface may be referred to as a rear surface and the second main surface may be referred to as a front surface. In the present embodiment, the surface that is close to and faces the mounting substrate is defined as a rear surface.

The module substrate 50 is, for example, a multilayer substrate, and is a multilayer resin substrate or the like formed by laminating a low temperature co-fired ceramics (LTCC) substrate and a glass epoxy substrate. The filters 21 to 24 and other circuit elements may be covered with epoxy resin or the like on the multilayer substrate.

In the above-described configuration, an input electrode 21$i$ of the filter 21 is connected to the I/O terminal 51 through a via wiring line and an in-layer wiring line that are built in the module substrate 50. A ground electrode 22$g$ of the filter 22 is connected to the external-connection ground terminal 52 through a via wiring line and an in-layer wiring line that are built in the module substrate 50.

The I/O terminal 51 and the external-connection ground terminal 52 are made of, for example, Ag, Cu, Al, Pt, a multilayer body made therefrom, or a conductive metallic material mainly containing any of their alloys. The module substrate 50 and the mounting substrate (mother board) are bonded to each other by bump bonding, solder bonding, wire bonding, or the like.

Figure 2B:
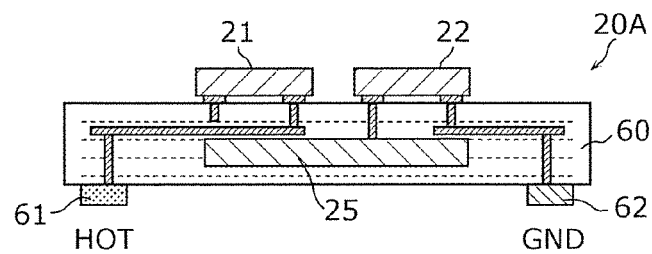
FIG. 2B is a cross-sectional configuration diagram of an RF module according to a first modification example of the first embodiment.

FIG. 2B is a cross-sectional configuration diagram of an RF module 20A according to a first modification example of the first embodiment. The RF module 20A illustrated in FIG. 2B is different from the RF module according to the first embodiment in that the switch IC 25 is not mounted on the rear surface of the module substrate 50 but is built in the module substrate 50. In the RF module according to the present disclosure, the switch IC 25 may be built in the module substrate 50, as in the RF module 20A.

Figure 2C:
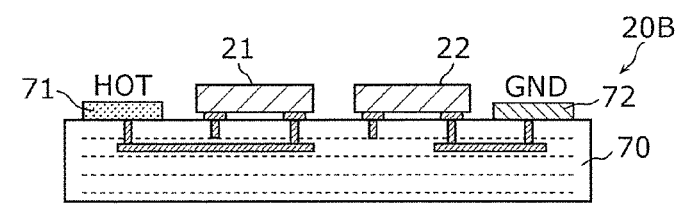
FIG. 2C is a cross-sectional configuration diagram of an RF module according to a second modification example of the first embodiment.

FIG. 2C is a cross-sectional configuration diagram of an RF module 20B according to a second modification example of the first embodiment. The RF module 20B illustrated in FIG. 2C is different from the RF module according to the first embodiment in that the switch IC 25 is not included and that an I/O terminal 71 and an external-connection ground terminal 72 are disposed on the front surface of the module substrate 50. In the RF module according to the present disclosure, the switch IC 25 may be omitted, and the I/O terminal 71 and the external-connection ground terminal 72 may be disposed on the mounting surface on which the filters 21 to 24 are mounted, as in the RF module 20B.

Alternatively, the switch IC 25 may be mounted on the surface on which the filters 21 to 24 are mounted, unlike in the cross-sectional configurations of the RF modules illustrated in FIGS. 2A and 2B. That is, the switch IC 25 and the filters 21 to 24 may be mounted on one surface of the module substrate 50.

[1.3 Layout of Electrodes and Terminals of RF Module]

FIGS. 3A, 3B and 3C include a perspective plan view, a front view, and a rear view illustrating the arrangement relationship among electrodes and terminals of the RF module according to the first embodiment. More specifically, FIG. 3A is a perspective plan view illustrating the arrangement and connection relationships among individual terminals disposed on the module substrate 50 and individual electrodes disposed on the rear surface of the filter 21. In FIG. 3A, the arrangement and connection relationships among the individual electrodes of the filters 22 to 24 are not illustrated. FIG. 3B is a perspective plan view of the filter 21, illustrating the arrangement relationship among the individual electrodes of the filter 21 mounted on the front surface 50$a$ of the module substrate 50. In FIG. 3B, the arrangement relationship among the individual electrodes of the filters 22 to 24 is not illustrated. FIG. 3C illustrates the arrangement relationship among the individual terminals on the rear surface 50$b$ of the module substrate 50. The cross-sectional configuration diagram in FIG. 2A is a cross-sectional view taken along line IIA-IIA in FIG. 3A.

As illustrated in FIG. 3C, an external-connection ground terminal 52$f$, and a plurality of I/O terminals or external-connection ground terminals are arranged in an outer peripheral portion of the rear surface 50$b$ of the module substrate 50. In addition, the switch IC 25 (not illustrated) is mounted in a center portion of the rear surface 50$b$ of the module substrate 50.

FIG. 3B illustrates surface-mounted circuit elements arranged in an outer peripheral portion of the front surface 50$a$ of the module substrate 50, and rear-surface electrode patterns 21$p$, 22$p$, 23$p$, and 24$p$ of the filters 21, 22, 23, and 24. Here, the rear-surface electrode patterns 21$p$ to 24$p$ respectively include I/O electrodes corresponding to input electrodes and output electrodes of the filters 21 to 24, and sensitive GND electrodes and non-sensitive GND electrodes corresponding to ground electrodes of the filters 21 to 24.

Each of the sensitive GND electrodes and non-sensitive GND electrodes is connected to any one of the plurality of external-connection ground terminals. Here, a sensitive GND electrode is a first ground electrode in which an inductance component or capacitance component of a wiring line connected to the sensitive GND electrode changes the bandpass characteristic and attenuation characteristic of the filter by a first change amount. On the other hand, a non-sensitive GND electrode is a second ground electrode in which, even if a wiring line is connected to the non-sensitive GND electrode, an inductance component or capacitance component of the wiring line changes the bandpass characteristic and attenuation characteristic of the filter by a second change amount smaller than the first change amount.

FIG. 3A illustrates, in an overlapped manner, the external-connection ground terminal 52$f$ and the plurality of I/O terminals or external-connection ground terminals disposed on the rear surface 50$b$ of the module substrate 50, and the sensitive GND electrodes and non-sensitive GND electrodes included in the rear-surface electrode pattern 21$p$ of the filter 21.

The rear-surface electrode pattern 21$p$ of the filter 21 includes sensitive GND electrodes 21$a$ and 21$b$ and non-sensitive GND electrodes 21$x$, 21$y$, and 21$z$.

Although not illustrated, the rear-surface electrode pattern 22$p$ of the filter 22 includes sensitive GND electrodes and non-sensitive GND electrodes.

Although not illustrated, the rear-surface electrode pattern 23$p$ of the filter 23 includes sensitive GND electrodes and non-sensitive GND electrodes.

Although not illustrated, the rear-surface electrode pattern 24$p$ of the filter 24 includes sensitive GND electrodes and non-sensitive GND electrodes.

In the RF module 20 according to the present embodiment, the distances between the sensitive GND electrodes and the external-connection ground terminal connected to the sensitive GND electrodes (double-solid-line arrows in FIG. 3A) are smaller than the distances between the non-sensitive GND electrodes and the external-connection ground terminal connected to the non-sensitive GND electrodes (the broken-line arrows in FIG. 3A) in a plan view of the module substrate 50.

According to the above-described configuration, a parasitic inductance component interposed between the sensitive GND electrode (first ground electrode), which is sensitive to a change in the bandpass characteristic and attenuation characteristic of the RF module 20, and the external-connection ground terminal can be made smaller than a parasitic inductance component interposed between the non-sensitive GND electrode (second ground electrode), which is not sensitive to a change in the bandpass characteristic and attenuation characteristic of the RF module 20, and the external-connection ground terminal. Accordingly, degradation in the attenuation characteristics and bandpass characteristics of the filters 21 to 24 can be suppressed. That is, the distances between the ground electrodes of the filters 21 to 24 and the external-connection ground terminals of the module substrate 50 are optimized by the degree of change in the bandpass characteristic and attenuation characteristic, and thus degradation in the attenuation characteristics and bandpass characteristics of the filters 21 to 24 can be suppressed.

Hereinafter, the sensitive GND electrodes and non-sensitive GND electrodes will be described in detail by using the configurations of the filters 21 to 24.

[1.4 Circuit Configuration of Filter Element]

Figure 4A:
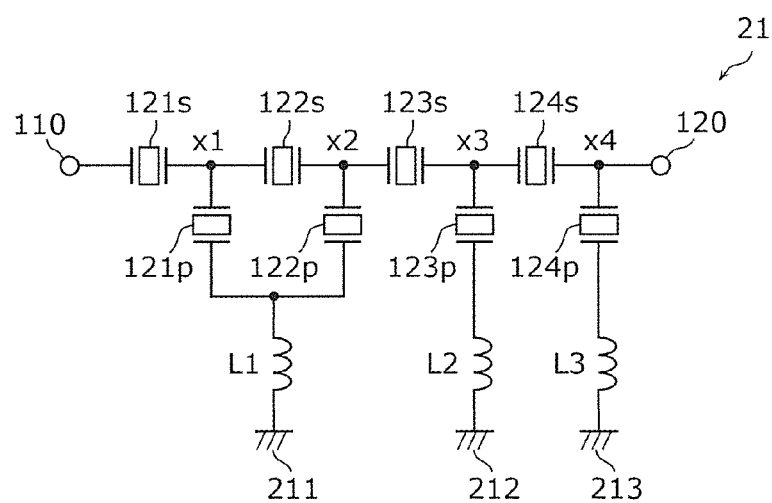
FIG. 4A is a circuit configuration diagram of a filter element according to the first embodiment.

FIG. 4A is a circuit configuration diagram of the filter 21 according to the first embodiment. The filter 21 illustrated in FIG. 4A includes an input electrode 110, an output electrode 120, series-arm resonators 121s to 124s, parallel-arm resonators 121p to 124p, and ground electrodes 211, 212, and 213.

The series-arm resonators 121s to 124s are acoustic wave resonators arranged in series on a path that connects the input electrode 110 and the output electrode 120.

The parallel-arm resonator 121p is an acoustic wave resonator connected between the ground electrode 211 and a node x1 on the path that connects the input electrode 110 and the output electrode 120.

The parallel-arm resonator 122p is an acoustic wave resonator connected between the ground electrode 211 and a node x2 on the path that connects the input electrode 110 and the output electrode 120.

The parallel-arm resonator 123p is an acoustic wave resonator connected between the ground electrode 212 and a node x3 on the path that connects the input electrode 110 and the output electrode 120.

The parallel-arm resonator 124p is an acoustic wave resonator connected between the ground electrode 213 and a node x4 on the path that connects the input electrode 110 and the output electrode 120.

With the above-described connections, the filter 21 serves as a ladder bandpass filter circuit having series-arm resonators and parallel-arm resonators.

Each of the filters 22 to 24 may be a ladder bandpass filter including series-arm resonators and parallel-arm resonators, like the configuration of the filter 21. The filters 21 to 24 need not necessarily have the ladder resonator structure. It is sufficient for the filters 21 to 24 to have one or more acoustic wave resonators connected between a ground electrode and the path that connects the input electrode 110 and the output electrode 120.

Figure 4B:
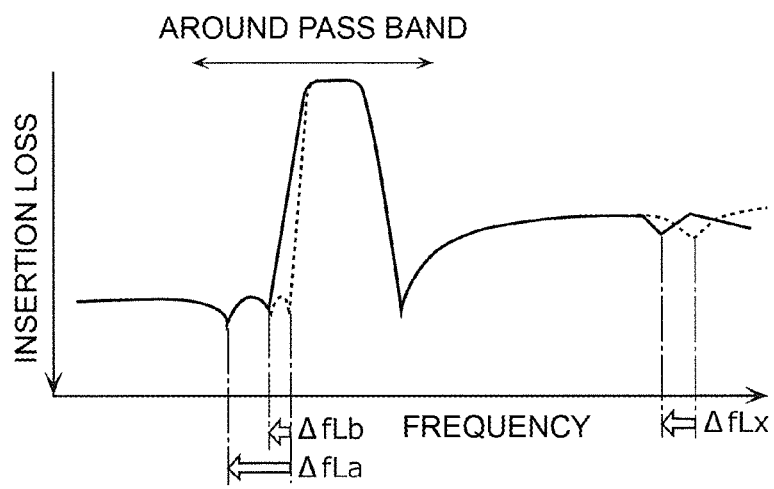
FIG. 4B is a schematic diagram illustrating the bandpass characteristic and attenuation characteristic of the filter element according to the first embodiment.

FIG. 4B is a schematic diagram illustrating the bandpass characteristic and attenuation characteristic of the filter 21 according to the first embodiment. As illustrated in FIG. 4B, the filter 21 has a bandpass characteristic and attenuation characteristic of passing the frequencies in a predetermined frequency band (pass band) with low loss and attenuating the frequencies near the pass band in the low-frequency side and high-frequency side of the pass band. Here, attenuation poles corresponding to the resonant frequencies of the parallel-arm resonators 121p, 122p, and 123p are formed near the pass band in the low-frequency side of the pass band. In a harmonic band of an RF signal of the pass band, an attenuation pole corresponding to the resonant frequency of the parallel-arm resonator 124p is formed.

In the filter characteristics illustrated in FIG. 4B, inductance components L1, L2, and L3 illustrated in FIG. 4A shift the attenuation poles corresponding to the parallel-arm resonators 121p to 124p to the low-frequency side. The inductance component L1 is, for example, a parasitic inductance generated by the wiring line that connects the parallel-arm resonators 121p and 122p and the ground electrode 211. The inductance component L2 is, for example, a parasitic inductance generated by the wiring line that connects the parallel-arm resonator 123p and the ground electrode 212. That is, the ground electrode 211 is connected in common to two parallel-arm resonators, the parallel-arm resonators 121p and 122p, and the ground electrode 212 is connected to only one parallel-arm resonator, the parallel-arm resonator 123p. The inductance component L3 is, for example, a parasitic inductance generated by the wiring line that connects the parallel-arm resonator 124p and the ground electrode 213. The inductance components L1, L2, and L3 need not necessarily be parasitic inductance components generated by the above-described wiring lines and may be components that are intentionally designed by using coil patterns and chip inductors.

Here, a frequency shift amount $\Delta$fLa (first shift amount) by which the resonant frequencies (attenuation poles) of the two parallel-arm resonators 121p and 122p are shifted to the low-frequency side by the inductance component L1 is larger than a frequency shift amount $\Delta$fLb (second shift amount) by which the resonant frequency (attenuation pole) of the one parallel-arm resonator 123p is shifted to the low-frequency side by the inductance component L2. In this case, a relative definition is given in which the ground electrode 211 for generating an inductance component La is a sensitive GND electrode, and the ground electrode 212 for generating an inductance component Lb is a non-sensitive GND electrode. In this case, the ground electrode 211 corresponds to, for example, the sensitive GND electrode 21a in FIGS. 3A, 3B and 3C, and the ground electrode 212 corresponds to, for example, the non-sensitive GND electrode 21x in FIGS. 3A, 3B and 3C. That is, the ground electrodes 211 and 212 are arranged such that the distance between the sensitive GND electrode 21a and the external-connection ground terminal 52f connected to the sensitive GND electrode 21a (the double-solid-line arrow in FIG. 3A) is smaller than the distance between the non-sensitive GND electrode 21x and the external-connection ground terminal 52f connected to the non-sensitive GND electrode 21x (the broken-line arrow in FIG. 3A) in a plan view of the module substrate 50.

Accordingly, the parasitic inductance component interposed between the ground electrode 211 (first ground electrode), which is sensitive to a change in the bandpass characteristic and attenuation characteristic of the RF module 20, and the external-connection ground terminal 52f can be made smaller than the parasitic inductance component interposed between the ground electrode 212 (second ground electrode), which is not as sensitive to a change of the bandpass characteristic and attenuation characteristic as the ground electrode 211, and the external-connection ground terminal 52f. That is, the distances between the ground electrodes and the external-connection ground terminal are optimized by the degree of change in the attenuation poles near the pass band, and thus degradation in the attenuation characteristic and bandpass characteristic of the filter 21 can be suppressed.

Next, in the filter characteristics illustrated in FIG. 4B, a frequency shift amount $\Delta$fLX by which the resonant frequency (attenuation pole) of the parallel-arm resonator 124p is shifted to the low-frequency side in the harmonic band by the inductance component L3 is defined relative to the frequency shift amount $\Delta$fLa and the frequency shift amount $\Delta$fLb. Here, even if the resonant frequency (attenuation pole) is shifted by the frequency shift amount $\Delta$fLX by the inductance component L3 from the viewpoint of securing attenuation in a relatively wide harmonic band, the amount of attenuation in the harmonic band does not sensitively change. Furthermore, even if the resonant frequency (attenuation pole) of the parallel-arm resonator 124p is shifted to the low-frequency side by the inductance component L3, the attenuation pole near the pass band is hardly shifted. That is, the frequency shift amount ΔfLa or ΔfLb (first shift amount) by which the attenuation pole near the pass band is shifted to the low-frequency side by the inductance component L1 or L2 is larger than the frequency shift amount (second shift amount) by which the attenuation pole near the pass band is shifted to the low-frequency side by the inductance component L3. In this case, a relative definition is given in which the ground electrodes 211 and 212 for generating the inductance components La and Lb are sensitive GND electrodes, and the ground electrode 213 for generating the inductance component L3 is a non-sensitive GND electrode. In this case, the ground electrode 211 corresponds to, for example, the sensitive GND electrode 21a in FIGS. 3A, 3B and 3C, the ground electrode 212 corresponds to, for example, the sensitive GND electrode 21b in FIGS. 3A, 3B and 3C, and the ground electrode 213 corresponds to, for example, the non-sensitive GND electrode 21x in FIGS. 3A, 3B and 3C. That is, the ground electrodes 211, 212, and 213 are arranged such that the distances between the sensitive GND electrodes 21a and 21b and the external-connection ground terminal 52f (the double-solid-line arrows in FIG. 3A) are smaller than the distance between the non-sensitive GND electrode 21x and the external-connection ground terminal 52f (the broken-line arrow in FIG. 3A) in a plan view of the module substrate 50.

Accordingly, the parasitic inductance components interposed between the ground electrodes 211 and 212 (first ground electrodes), which are sensitive to a change in the bandpass characteristic and attenuation characteristic of the RF module 20, and the external-connection ground terminal 52f can be made smaller than the parasitic inductance component interposed between the ground electrode 213 (second ground electrode), which is not as sensitive to a change of the bandpass characteristic and attenuation characteristic as the ground electrodes 211 and 212, and the external-connection ground terminal 52f. That is, the distances between the ground electrodes and the external-connection ground terminal are optimized by the degree of change in the attenuation poles near the pass band, and thus degradation in the attenuation characteristic and bandpass characteristic of the filter 21 can be suppressed.

Figure 5:
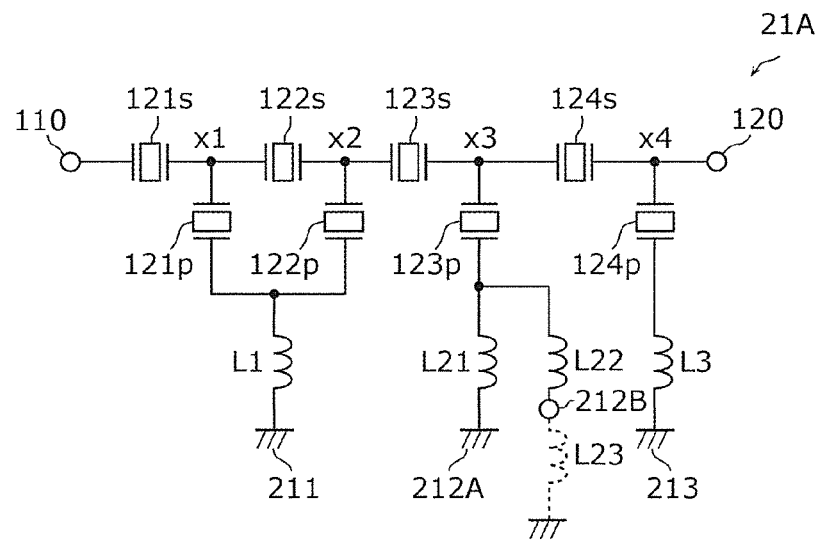
FIG. 5 is a circuit configuration diagram of a filter element according to a third modification example of the first embodiment.

FIG. 5 is a circuit configuration diagram of a filter 21A according to a third modification example of the first embodiment. The filter 21A illustrated in FIG. 5 includes the input electrode 110, the output electrode 120, the series-arm resonators 121s to 124s, the parallel-arm resonators 121p and 124p, and ground electrodes 211, 212A, 212B, and 213. The filter 21A illustrated in FIG. 5 is different from the filter 21 according to the first embodiment in the connection between the ground electrodes and the parallel-arm resonators. Hereinafter, the filter 21A according to the present modification example will be described mainly about the difference from the filter 21 according to the first embodiment, and the same points will not be described.

The parallel-arm resonator 121p is an acoustic wave resonator connected between the ground electrode 211 and the node x1 on the path that connects the input electrode 110 and the output electrode 120.

The parallel-arm resonator 122p is an acoustic wave resonator connected between the ground electrode 211 and the node x2 on the path that connects the input electrode 110 and the output electrode 120.

The parallel-arm resonator 123p is an acoustic wave resonator connected between the ground electrodes 212A and 212B and the node x3 on the path that connects the input electrode 110 and the output electrode 120.

The parallel-arm resonator 124p is an acoustic wave resonator connected between the ground electrode 213 and the node x4 on the path that connects the input electrode 110 and the output electrode 120.

With the above-describe connections, the filter 21A serves as a ladder bandpass filter circuit having series-arm resonators and parallel-arm resonators.

Here, one of the terminals of the parallel-arm resonator 123p is connected to the node x3, and the other terminal of the parallel-arm resonator 123p is connected to the ground electrodes 212A and 212B. On the other hand, one of the terminals of the parallel-arm resonator 121p is connected to the node x1, and the other terminal of the parallel-arm resonator 121p is connected to only one ground electrode, the ground electrode 211. One of the terminals of the parallel-arm resonator 122p is connected to the node x2, and the other terminal of the parallel-arm resonator 122p is connected to only one ground electrode, the ground electrode 211.

In this configuration, the parallel-arm resonator 123p is connected to the two ground electrodes 212A and 212B, and thus inductance components L21 and L22 are connected in parallel between the parallel-arm resonator 123p and the ground electrodes. Thus, the composite inductance component between the parallel-arm resonator 123p and the ground electrodes is smaller than each of the inductance components L21 and L22. Here, even if an inductance component L23 is generated by connecting the ground electrode 212B and an external-connection ground terminal through a wiring line, the shift amount of the attenuation pole corresponding to the parallel-arm resonator 123p is smaller than in a case where the parallel-arm resonator 123p is connected to only one ground electrode.

That is, the frequency shift amount (second shift amount) by which the resonant frequency (attenuation pole) of the parallel-arm resonator 123p is shifted to the low-frequency side by the inductance component L22 when the parallel-arm resonator 123p is connected to two ground electrodes, the ground electrodes 212A and 212B, is smaller than the frequency shift amount (first shift amount) by which the resonant frequency (attenuation pole) of the parallel-arm resonator 123p is shifted to the low-frequency side by an inductance component generated when the parallel-arm resonator 123p is connected to only one ground electrode. In this case, a relative definition is given in which the ground electrodes 212B and 212A for generating the inductance component L22 are non-sensitive GND electrodes, and the ground electrode 211 is a sensitive GND electrode. In this case, the ground electrode 211 corresponds to, for example, the sensitive GND electrode 21a in FIGS. 3A, 3B and 3C, and the ground electrodes 212A and 212B correspond to, for example, the non-sensitive GND electrodes 21x and 21y in FIGS. 3A, 3B and 3C. That is, the ground electrodes 211, 212A, and 212B are arranged such that the distance between the sensitive GND electrode 21a and the external-connection ground terminal 52f (the double-solid-line arrow in FIG. 3A) is smaller than the distances between the non-sensitive GND electrodes 21x and 21y and the external-connection ground terminal 52f (the broken-line arrows in FIG. 3A) in a plan view of the module substrate 50.

Accordingly, the parasitic inductance component interposed between the ground electrode 211 (first ground electrode), which is sensitive to a change in the bandpass characteristic and attenuation characteristic of the RF module 20, and the external-connection ground terminal 52f can be made smaller than the parasitic inductance component interposed between the ground electrodes 212A and 212B (second ground electrodes), which are not as sensitive to a change of the bandpass characteristic and attenuation characteristic as the ground electrode 211, and the external-connection ground terminal 52f. Accordingly, degradation in the attenuation characteristic and bandpass characteristic of the filter 21A can be suppressed. That is, the distances between the ground electrodes and the external-connection ground terminal are optimized by the number of ground electrodes connected to one parallel-arm resonator, and thus degradation in the attenuation characteristic and bandpass characteristic of the filter 21A can be suppressed.

[1.5 Arrangement of Electrodes in Filter Element]

Figure 6:
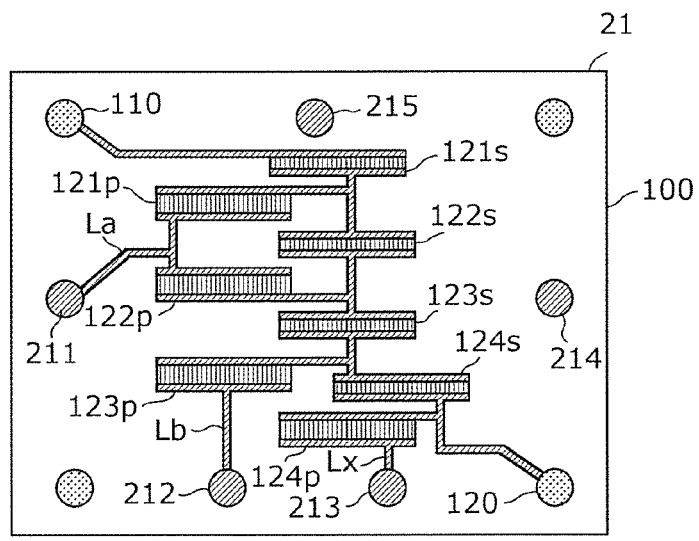
FIG. 6 is a plan view illustrating the arrangement of electrodes in the filter element according to the first embodiment.

FIG. 6 is a plan view illustrating the arrangement of electrodes in the filter 21 according to the first embodiment. As illustrated in FIG. 6, the filter 21 is, for example, a surface acoustic wave (SAW) filter disposed on a piezoelectric substrate 100 and has the circuit configuration illustrated in FIG. 4A. Each of the series-arm resonators $121s$ to $124s$ and the parallel-arm resonators $121p$ to $124p$ is formed of an interdigital transducer (IDT) electrode disposed on the piezoelectric substrate 100.

Here, the filter 21 is, for example, a circuit element that is flip-chip mounted on the front surface 50a of the module substrate 50. In this case, it is necessary to secure the electrical connection between the module substrate 50 and the filter 21 and to secure the bonding strength between the module substrate 50 and the filter 21. From this point of view, ground electrodes 214 and 215, which are not connected to the electrodes and wiring lines constituting the filter 21 and which are not used to secure the electrical connection between the module substrate 50 and the filter 21, are connected to electrodes on the front surface 50a of the module substrate 50 and are connected to the external-connection ground terminals on the rear surface 50b. In this case, the ground electrodes 214 and 215 are defined as non-sensitive electrodes (second ground electrodes) that are not connected to any electrodes and wiring lines disposed on the piezoelectric substrate 100 and that do not affect the RF transmission characteristic of the filter 21.

On the other hand, the ground electrodes 211 to 213 are defined as sensitive electrodes (first ground electrodes) that are connected to the electrodes and wiring lines constituting the filter 21 and that affect the RF transmission characteristic of the filter 21. In this case, the ground electrodes 211 to 213 correspond to, for example, the sensitive GND electrode 21a or 21b in FIGS. 3A, 3B and 3C, and the ground electrodes 214 and 215 correspond to, for example, the non-sensitive GND electrodes 21y and 21z in FIGS. 3A, 3B and 3C. That is, the ground electrodes 211 to 215 are arranged such that the distances between the sensitive GND electrodes 21a and 21b and the external-connection ground terminal 52f (the double-solid-line arrows in FIG. 3A) are smaller than the distances between the non-sensitive GND electrodes 21y and 21z and the external-connection ground terminal 52f (the broken-line arrows in FIG. 3A) in a plan view of the module substrate 50.

When an inductance component and a capacitance component are interposed between the electrodes and wiring lines constituting the filter 21 and the ground electrodes, the RF transmission characteristic of the filter 21 is changed. Furthermore, the RF transmission characteristic may be degraded by the parasitic inductance and parasitic capacitance interposed between a ground electrode in the filter 21 and an external-connection ground terminal disposed on the module substrate 50.

According to the above-described configuration, the sensitive electrode that causes the RF transmission characteristic to be degraded by an inductance component interposed between the sensitive electrode and the above-described electrode and wiring line, is closer to the external-connection ground terminal than the non-sensitive electrode that is not connected to the above-described electrode and wiring line. This makes it possible to reduce the parasitic inductance component interposed between the sensitive electrode (first ground electrode), which is sensitive to a change in the transmission characteristic of the RF module, and the external-connection ground terminal. Accordingly, degradation in the RF transmission characteristic of the filter 21 can be suppressed. That is, the distance between the ground electrode and the external-connection ground terminal is optimized by whether or not the ground electrode is connected to the above-described electrode and wiring line, and thus degradation in the RF transmission characteristic of the filter 21 can be suppressed.

Alternatively, the filters 21 to 24 may be bulk acoustic wave (BAW) filters. The above-described piezoelectric substrate 100 may be a substrate having piezoelectricity at least on the front surface thereof. For example, the above-described piezoelectric substrate 100 may include a piezoelectric thin film on the front surface thereof and may be formed of a multilayer body including a film in which the acoustic velocity is different from that in the piezoelectric thin film, and a supporting substrate or the like. Alternatively, the entire piezoelectric substrate 100 may have piezoelectricity. In this case, the piezoelectric substrate 100 is formed of a single piezoelectric layer.

(Second Embodiment)

In the first embodiment, a description has been given of the arrangement of ground electrodes of a filter element mounted on the front surface of a module substrate. In the present embodiment, a description will be given of the arrangement of ground electrodes of an IC chip mounted on a module substrate.

[2.1 Configuration of RF Module]

Figure 7:
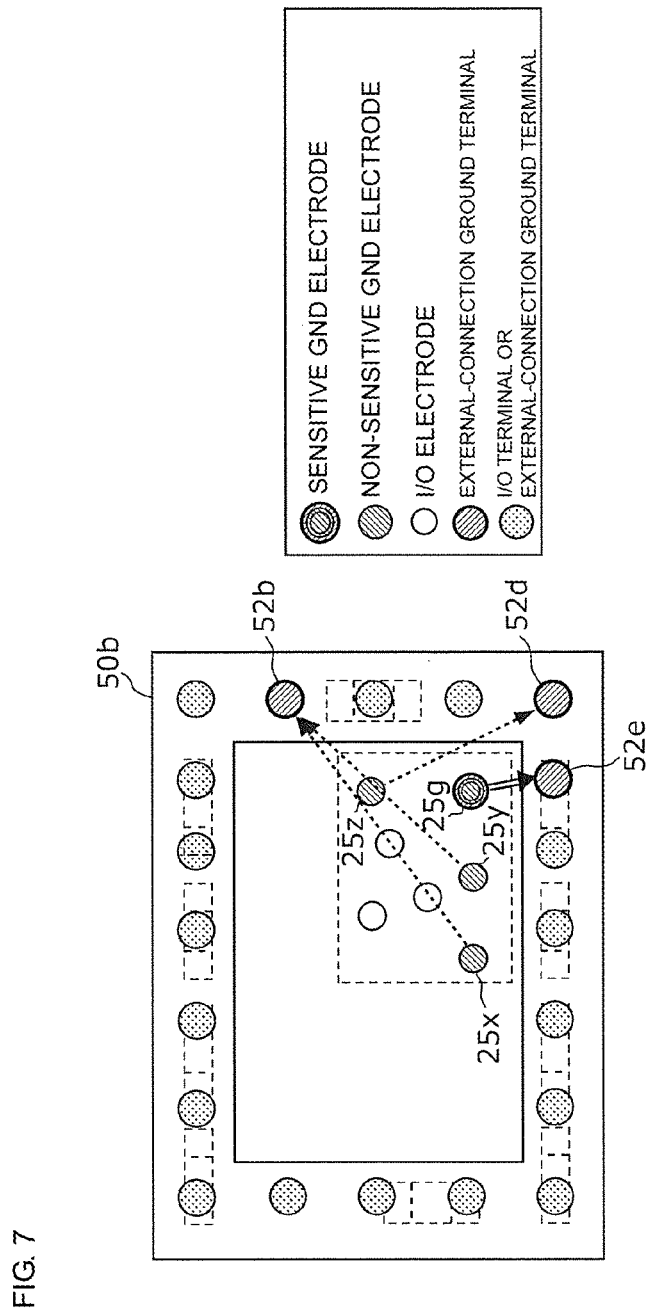
FIG. 7 is a plan view illustrating the arrangement relationship among electrodes and terminals of an RF module according to a second embodiment.

FIG. 7 is a plan view illustrating the arrangement relationship among electrodes and terminals of the RF module according to the second embodiment. The RF module according to the present embodiment has the cross-sectional configuration illustrated in FIG. 2A. FIG. 7 is a perspective plan view illustrating the arrangement and connection relationships among the individual terminals disposed in an outer peripheral portion of the rear surface of the module substrate 50 and the individual electrodes disposed (in a partial region) in the switch IC 25.

FIG. 7 illustrates external-connection ground terminals 52b, 52d, and 52e and a plurality of I/O terminals or external-connection ground terminals that are disposed on the rear surface 50b of the module substrate 50, and a sensitive GND electrode 25g and non-sensitive GND electrodes 25x to 25z included in a rear-surface electrode pattern of the switch IC 25. In FIG. 7, only a partial region (the region enclosed with a broken line) is illustrated as for the rear-surface electrode pattern of the switch IC 25.

Each of the sensitive GND electrodes and non-sensitive GND electrodes is connected to any one of the external-connection ground terminals. Here, a sensitive GND electrode is a first ground electrode in which an inductance component or capacitance component of a wiring line connected to the sensitive GND electrode changes the RF transmission characteristic of the switch IC by a first change amount. On the other hand, a non-sensitive GND electrode is a second ground electrode in which, even if a wiring line is connected to the non-sensitive GND electrode, an inductance component or capacitance component of the wiring line changes the RF transmission characteristic of the switch IC by a second change amount smaller than the first change amount.

In the RF module according to the present embodiment, the distance between the sensitive GND electrode and the external-connection ground terminal connected to the sensitive GND electrode (the double-solid-line arrow in FIG. 7) is smaller than the distances between the non-sensitive GND electrodes and the external-connection ground terminals connected to the non-sensitive GND electrodes (the broken-line arrows in FIG. 7) in a plan view of the module substrate 50.

According to the above-described configuration, a parasitic inductance component or parasitic capacitance component interposed between the sensitive GND electrode (first ground electrode), which is sensitive to a change in the RF transmission characteristic of the RF module, and the external-connection ground terminal can be made smaller than a parasitic inductance component or parasitic capacitance interposed between the non-sensitive GND electrode (second ground electrode), which is not sensitive to a change in the RF transmission characteristic of the RF module, and the external-connection ground terminal. Accordingly, degradation in the RF transmission characteristic of the switch IC 25 can be suppressed. That is, the distances between the ground electrodes of the switch IC 25 and the external-connection ground terminals of the module substrate 50 are optimized by the degree of change in the RF transmission characteristic, and thus degradation in the RF transmission characteristic of the switch IC 25 can be suppressed.

Hereinafter, the sensitive GND electrode and non-sensitive GND electrode will be described in detail by using a specific configuration of the switch IC 25.

[2.2 Configuration of Switch IC]

Figure 8A:
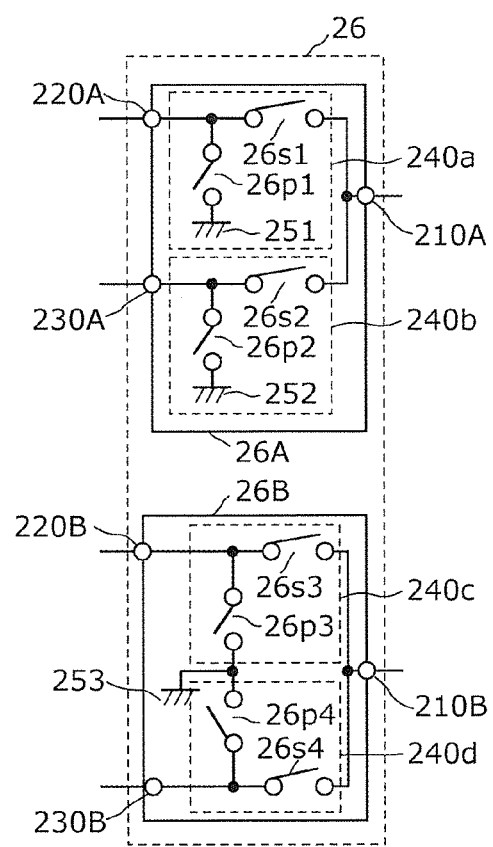
FIG. 8A is a circuit configuration diagram of a switch IC according to the second embodiment.

FIG. 8A is a circuit configuration diagram of a switch IC 26 according to the second embodiment. The switch IC 26 illustrated in FIG. 8A corresponds to a specific circuit configuration of the switch IC 25 illustrated in FIG. 1.

The switch IC 26 is constituted by switches 26A and 26B.

The switch 26A has a common terminal 210A, selection terminals 220A and 230A, and unit switch circuits 240$a$ and 240$b$. The unit switch circuit 240$a$ has the selection terminal 220A (input electrode), the common terminal 210A (output electrode), a unit ground electrode 251, a series switch 26$s$1, and a shunt switch 26$p$1, and switches between continuity and non-continuity between the selection terminal 220A and the common terminal 210A. The unit switch circuit 240$b$ has the selection terminal 230A (input electrode), the common terminal 210A (output electrode), a unit ground electrode 252, a series switch 26$s$2, and a shunt switch 26$p$2, and switches between continuity and non-continuity between the selection terminal 230A and the common terminal 210A. In the switch 26A, to achieve the continuity between the common terminal 210A and the selection terminal 220A and the non-continuity between the common terminal 210A and the selection terminal 230A, for example, the series switch 26$s$1 is turned ON, the shunt switch 26$p$1 is turned OFF, the series switch 26$s$2 is turned OFF, and the shunt switch 26$p$2 is turned ON.

The switch 26B has a common terminal 210B, selection terminals 220B and 230B, and unit switch circuits 240$c$ and 240$d$. The unit switch circuit 240$c$ has the selection terminal 220B (input electrode), the common terminal 210B (output electrode), a unit ground electrode 253, a series switch 26$s$3, and a shunt switch 26$p$3, and switches between continuity and non-continuity between the selection terminal 220B and the common terminal 210B. The unit switch circuit 240$d$ has the selection terminal 230B (input electrode), the common terminal 210B (output electrode), the unit ground electrode 253, a series switch 26$s$4, and a shunt switch 26$p$4, and switches between continuity and non-continuity between the selection terminal 230B and the common terminal 210B. In the switch 26B, to achieve the continuity between the common terminal 210B and the selection terminal 220B and the non-continuity between the common terminal 210B and the selection terminal 230B, for example, the series switch 26$s$3 is turned ON, the shunt switch 26$p$3 is turned OFF, the series switch 26$s$4 is turned OFF, and the shunt switch 26$p$4 is turned ON.

Each of the unit ground electrodes 251 and 252 is connected to the non-sensitive GND electrode (second ground electrode) connected to the external-connection ground terminal of the module substrate 50. On the other hand, the unit ground electrode 253 is connected to the sensitive GND electrode (first ground electrode) connected to the external-connection ground terminal of the module substrate 50.

That is, the sensitive GND electrode (first ground electrode) is connected, in the switch IC 26, to the unit ground electrode 253 that is shared between the unit switch circuits 240$c$ and 240$d$ different from each other. On the other hand, the non-sensitive GND electrode (second ground electrode) is connected, in the switch IC 26, to one of the unit ground electrodes 251 and 252 provided for individual unit switch circuits.

When an inductance and a capacitance are interposed between each unit switch circuit constituting the switch IC 26 and the ground electrode, the RF transmission characteristic in each unit switch circuit and the isolation characteristic between the unit switch circuits are changed. Furthermore, a parasitic inductance and parasitic capacitance interposed between the ground electrode in the switch IC 26 and the external-connection ground terminal disposed on the module substrate 50 may degrade the above-described RF transmission characteristic and isolation characteristic.

According to the above-described configuration, the sensitive GND electrode (first ground electrode) that degrades the above-described RF transmission characteristic and isolation characteristic to a higher degree is closer to the external-connection ground terminal than the non-sensitive GND electrode (second ground electrode) that degrades the above-described RF transmission characteristic and isolation characteristic to a lower degree. Accordingly, the parasitic inductance component or parasitic capacitance interposed between the sensitive GND electrode, which is sensitive to a change of the above-described RF transmission characteristic and isolation characteristic, and the external-connection ground terminal can be made smaller than the parasitic inductance component or parasitic capacitance interposed between the non-sensitive GND electrode and the external-connection ground terminal. Accordingly, degradation in the above-described RF transmission characteristic and isolation characteristic of the switch IC 26 can be suppressed. That is, the distance between the ground electrode and the external-connection ground terminal is optimized in accordance with whether or not the ground electrode is connected in common to a plurality of unit ground electrodes, and thus degradation in the above-described RF transmission characteristic and isolation characteristic of the switch IC 26 can be suppressed.

Figure 8B:
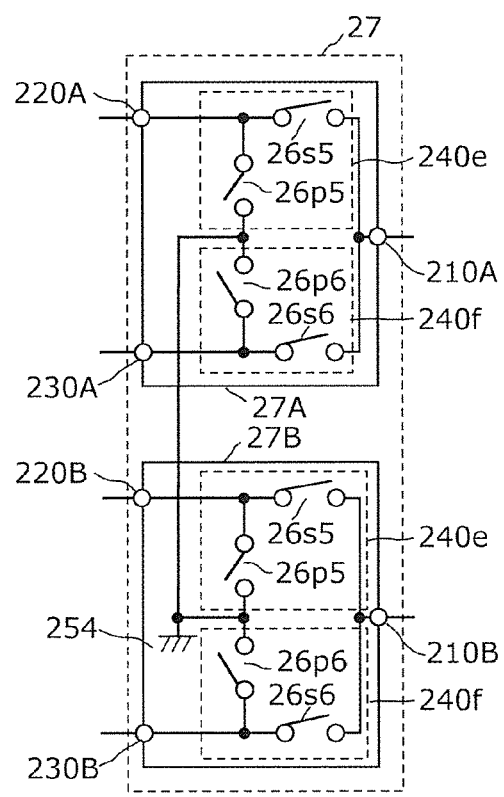
FIG. 8B is a circuit configuration diagram of a switch IC according to a modification example of the second embodiment.

FIG. 8B is a circuit configuration diagram of a switch IC 27 according to a modification example of the second embodiment. The switch IC 27 illustrated in FIG. 8B is different from the switch IC 26 according to the second embodiment in the connection relationship of a unit ground electrode. Hereinafter, the switch IC 27 according to the present modification example will be described mainly about the difference from the switch IC 26 according to the second embodiment, and the same points will not be described.

The switch IC 27 is constituted by switches 27A and 27B.

The switch 27A has the common terminal 210A, the selection terminals 220A and 230A, and unit switch circuits 240e and 240f. The unit switch circuit 240e has the selection terminal 220A (input electrode), the common terminal 210A (output electrode), a unit ground electrode 254, a series switch 26s5, and a shunt switch 26p5, and switches between continuity and non-continuity between the selection terminal 220A and the common terminal 210A. The unit switch circuit 240f has the selection terminal 230A (input electrode), the common terminal 210A (output electrode), the unit ground electrode 254, a series switch 26s6, and a shunt switch 26p6, and switches between continuity and non-continuity between the selection terminal 230A and the common terminal 210A. In the switch 27A, to achieve the continuity between the common terminal 210A and the selection terminal 220A and the non-continuity between the common terminal 210A and the selection terminal 230A, for example, the series switch 26s5 is turned ON, the shunt switch 26p5 is turned OFF, the series switch 26s6 is turned OFF, and the shunt switch 26p6 is turned ON.

The switch 27B has the common terminal 210B, the selection terminals 220B and 230B, and the unit switch circuits 240e and 240f. The unit switch circuit 240e has the selection terminal 220B (input electrode), the common terminal 210B (output electrode), the unit ground electrode 254, the series switch 26s5, and the shunt switch 26p5, and switches between continuity and non-continuity between the selection terminal 220B and the common terminal 210B. The unit switch circuit 240f has the selection terminal 230B (input electrode), the common terminal 210B (output electrode), the unit ground electrode 254, the series switch 26s6, and the shunt switch 26p6, and switches between continuity and non-continuity between the selection terminal 230B and the common terminal 210B.

The unit ground electrode 254 is connected to the sensitive GND electrode (first ground electrode) connected to the external-connection ground terminal of the module substrate 50.

That is, the sensitive GND electrode (first ground electrode) is shared between the switches 27A and 27B and is connected, in the switch IC 27, to the unit ground electrode 254 that is shared among four different unit switch circuits. On the other hand, the non-sensitive GND electrode (second ground electrode) is not connected to any unit ground electrode.

According to the above-described configuration, the sensitive GND electrode (first ground electrode) that degrades the above-described RF transmission characteristic and isolation characteristic to a higher degree is closer to the external-connection ground terminal than the non-sensitive GND electrode (second ground electrode) that degrades the above-described RF transmission characteristic and isolation characteristic to a lower degree. Accordingly, the parasitic inductance component or parasitic capacitance interposed between the sensitive GND electrode, which is sensitive to a change of the above-described RF transmission characteristic and isolation characteristic, and the external-connection ground terminal can be made smaller than the parasitic inductance component or parasitic capacitance interposed between the non-sensitive GND electrode and the external-connection ground terminal. Accordingly, degradation in the above-described RF transmission characteristic and isolation characteristic of the switch IC 26 can be suppressed. That is, the distance between the ground electrode and the external-connection ground terminal is optimized in accordance with whether or not the ground electrode is connected in common to a plurality of unit ground electrodes, and thus degradation in the above-described RF transmission characteristic and isolation characteristic of the switch IC 27 can be suppressed.

(Other Embodiments)

The RF module and communication apparatus according to embodiments of the present disclosure have been described in accordance with the embodiments, but the RF module and communication apparatus according to the present disclosure are not limited to the above-described embodiments. Another embodiment implemented by combining arbitrary components in the above-described embodiments, a modification example obtained by applying to the above-described embodiments various changes conceived by those skilled in the art without deviating from the gist of the present disclosure, and various apparatuses including the RF module and communication apparatus disclosed herein are included in the present disclosure.

For example, in the RF module and communication apparatus according to the above-described embodiments, another RF circuit element, wiring line, and the like may be disposed between the paths that connect the circuit elements and signal paths disclosed in the drawings.

The RF module according to the present disclosure may have, instead of the switch ICs 25 to 27, an IC including an amplifier element incorporated therein. In this case, a ground electrode that changes the gain of the amplifier element by using an inductance component or capacitance component is defined as a sensitive GND electrode (first ground electrode), and a ground electrode that does not change the gain of the amplifier element is defined as a non-sensitive GND electrode (second ground electrode).

Each of the switch ICs 25, 26, and 27 may be formed of complementary metal oxide semiconductor (CMOS). This makes it possible to manufacture the switch ICs at low cost.

Alternatively, the switch ICs may be formed of GaAs. This makes it possible to output an RF signal having high-quality amplification performance and noise performance.

The switch IC according to the present disclosure may be large scale integration (LSI) which is an integrated circuit. The circuit integration may be realized by a dedicated circuit or a general-purpose processor. A field programmable gate array (FPGA) that can be programmed after LSI manufacturing, or a reconfigurable processor in which the connections and settings of a circuit cell in LSI are reconfigurable may be used. Furthermore, if the progress of semiconductor technologies or other derived technologies produce a circuit integration technology that replaces LSI, integration of functional blocks may of course be performed by using the technology.

The present disclosure as an RF module disposed at a multi-band/multi-mode front-end portion is widely applicable to communication apparatuses such as cellular phones.

1 communication apparatus
2 antenna element
3A, 3B receiving amplifier circuit
4 RF signal processing circuit (RFIC)
10 switch group
20, 20A, 20B radio-frequency module
21, 21A, 22, 23, 24 filter
21a, 21b, 25g sensitive GND electrode
21i, 110 input electrode
21p, 22p, 23p, 24p rear-surface electrode pattern
21x, 21y, 21z, 25x, 25y, 25z non-sensitive GND electrode
22g ground electrode
25, 26, 27 switch IC
25A, 25B, 26A, 26B, 27A, 27B switch
26p1, 26p2, 26p3, 26p4, 26p5, 26p6 shunt switch
26s1, 26s2, 26s3, 26s4, 26s5, 26s6 series switch
50, 60, 70 module substrate
50a front surface
50b rear surface
51, 61, 71 I/O terminal
52, 52b, 52d, 52e, 52f, 62, 72 external-connection ground terminal
100 piezoelectric substrate
120 output electrode
121p, 122p, 123p, 124p parallel-arm resonator
121s, 122s, 123s, 124s series-arm resonator
210A, 210B common terminal
211, 212, 212A, 212B, 213, 214, 215 ground electrode
220A, 220B, 230A, 230B selection terminal
240a, 240b, 240c, 240d, 240e, 240f unit switch circuit
251, 252, 253, 254 unit ground electrode

The invention claimed is:

1. A radio-frequency module comprising:
a module substrate having a first main surface and a second main surface that face away from each other and a plurality of external-connection ground terminals;
a circuit element mounted on the first main surface of the module substrate; and
a switch IC mounted on the second main surface of the module substrate, wherein
the circuit element has
a circuit substrate,
an input electrode and an output electrode that are disposed on the circuit substrate,
a first ground electrode disposed on the circuit substrate and connected to one of the plurality of external-connection ground terminals, and
a second ground electrode disposed on the circuit substrate and connected to one of the plurality of external-connection ground terminals,
the first ground electrode is connected, on the circuit substrate, to an electrode or a wiring line that is disposed on the circuit substrate,
the second ground electrode is not connected to either of the electrode and the wiring line that are disposed on the circuit substrate, and
a distance between the first ground electrode and a first external-connection ground terminal connected to the first ground electrode is smaller than a distance between the second ground electrode and the first external-connection ground terminal connected to the second ground electrode in plan view of the module substrate.

2. A communication apparatus comprising:
the radio-frequency module according to claim 1; and
an RF signal processing circuit that processes a radio-frequency signal received from the radio-frequency module.

* * * * *